United States Patent
Lee

[11] Patent Number: 5,825,254
[45] Date of Patent: Oct. 20, 1998

[54] FREQUENCY CONVERTER FOR OUTPUTTING A STABLE FREQUENCY BY FEEDBACK VIA A PHASE LOCKED LOOP

[75] Inventor: Sang-Bok Lee, Seoul, Rep. of Korea

[73] Assignee: SamSung Electronics Co., Ltd., Suwon, Rep. of Korea

[21] Appl. No.: 816,947

[22] Filed: Mar. 19, 1997

[30] Foreign Application Priority Data

Mar. 19, 1996 [KR] Rep. of Korea ............... 1996 7418

[51] Int. Cl.⁶ .................................................. H03L 7/00
[52] U.S. Cl. ........................ 331/25; 331/2; 455/260; 455/313; 455/323; 455/76; 455/118; 455/119; 327/113; 327/117; 327/156; 327/105
[58] Field of Search ........................... 327/113, 117, 327/156, 105; 331/25, 2; 455/260, 313, 323, 76, 118, 119

[56] References Cited

U.S. PATENT DOCUMENTS

| | | | |
|---|---|---|---|
| 4,831,339 | 5/1989 | Nemeth | 331/25 |
| 4,862,106 | 8/1989 | Toda et al. | 331/2 |
| 5,019,785 | 5/1991 | Fognini et al. | 328/14 |
| 5,384,551 | 1/1995 | Kennedy et al. | 331/17 |
| 5,414,391 | 5/1995 | Hori | 331/16 |
| 5,498,998 | 3/1996 | Gehrke et al. | 331/17 |
| 5,568,098 | 10/1996 | Horie et al. | 331/16 |

OTHER PUBLICATIONS

*Basic principles of the Frequency Synthesis Theory* by Shapiro D.N., et al., Moscow, Radio–Yi–Svyas publishers, 1981, p. 155.
*Radio Receiving Devices* by Chistyakov N.T. et al. Moscow, "Svyaz" publishers, 1974, pp. 18–19.
*Phase–locked Loops* by Shahghildyan V.V., et al., Moscow, SVYAZ publishers, 1972, pp. 27–28.

Primary Examiner—David C. Nelms
Assistant Examiner—Andrew Q. Tran
Attorney, Agent, or Firm—Robert E. Bushnell, Esq.

[57] ABSTRACT

A frequency converter capable of providing a highly stable frequency by frequency feedback using a phase locked loop circuit. The frequency converter includes a local oscillator; a frequency converter for mixing an output of the local oscillator and a feedback frequency therefrom to generate a mixed frequency; a first filter for filtering the mixed frequency; a phase comparator for generating a voltage signal corresponding to a phase difference in between an input frequency to the frequency convertor and the output frequency of the first filter; a second filter for converting the voltage signal of the phase comparator to a constant polarity voltage and eliminating any noise component of the converted voltage signal; and a voltage controlled oscillator receiving the output of the second filter as a control voltage so as to provide a stable output frequency by generating the feedback frequency responsive to the control voltage.

15 Claims, 2 Drawing Sheets

FREQUENCY CONVERTER FOR OUTPUTTING A STABLE FREQUENCY BY FEEDBACK VIA A PHASE LOCKED LOOP

CLAIM OF PRIORITY

This application makes reference to, incorporates the same herein, and claims all benefits accruing under 35 U.S.C §119 from an application entitled *Frequency Converter For Outputting Stable Frequency* earlier filed in the Korean Industrial Property Office on the 19$^{th}$ of March 1996, and there duly assigned Serial No. 96-7418 by that Office.

BACKGROUND OF THE INVENTION

1. Field of the Invention

The present invention relates to a frequency converter and, in particular, to a frequency converter for obtaining a more stable frequency by feedback, via a phase locked loop, of its output frequency.

2. Description of the Related Art

In contemporary design practice of frequency converters, the output of a mixer fed an input frequency $fi$ and a local oscillation frequency $fosc$, is generally converted to the output frequency $fo$, and it is usually necessary to use a band pass filter exhibiting excellent characteristics in order to remove any harmonic components from the frequency applied to the mixer. I have observed that this practice often results in the generation of an unstable output frequency $fo$ because of appreciable harmonic components of the input frequency $fi$ and the local oscillation frequency $fosc$. Consequently, I have found that the errors that occur in achieving a desirable output frequency, frequently cause difficulty in providing a stable frequency for data or voice signals.

Examples of some known frequency converters are found in U.S. Pat. No. 5,384,551 to Richard A. Kennedy, et. al., entitled *Fast Locking Phase Locked Loop Frequency Synthesizer;* U.S. Pat. No. 5,414,391 to Hidetosi Hori entitled *Frequency Synthesizer With Frequency-Division Induced Phase Variation Canceler;* U.S. Pat. No. 5,498,998 to James K. Gehrke, et al., entitled *Method For Adjusting The Output Frequency Of A Frequency Synthesizer;* and U.S. Pat. No. 5,568,098 to Hiroshi Horie, et al., entitled *Frequency Synthesizer For Use In Radio Transmitter and Receiver.* The foregoing patents utilize a phase locked loop circuit in order to produce a more stable output frequency.

SUMMARY OF THE INVENTION

It is therefore an object of the present invention to provide an improved frequency conversion process and circuit.

It is another object to provide a process and circuit able to generate an output frequency exhibiting a greater degree of stability.

It is yet another object to provide a process and a frequency converter capable of providing a highly stable frequency by utilizing feedback in a phase locked loop circuit.

These and other objects may be achieved according to the principles of the present invention with a frequency converter constructed with a local oscillator; a frequency converter for mixing an output of the local oscillator and a feedback frequency therefrom to generate a mixed frequency; a first filter for filtering the mixed frequency; a phase comparator for generating a voltage signal corresponding to a phase difference in between an input frequency to the frequency convertor and the output frequency of the first filter; a second filter for converting the voltage signal of the phase comparator to a DC voltage and eliminating any noise component of the converted voltage signal; and a voltage controlled oscillator receiving the output of the second filter as a control voltage so as to provide a stable output frequency by generating the feedback frequency responsive to the control voltage.

A second aspect of the present invention can be accomplished with a frequency converter that may be constructed with a phase locked loop circuit for comparing a first feedback frequency with a reference signal provided from a set of channel selection signals, the channel selection signals comprising a data signal, a clock signal and an enable signal, and for generating a DC voltage responsive to the compared result; a first voltage controlled oscillator operably connected to an output of the phase locked loop circuit for generating an oscillation frequency under control of the output; a divider for dividing an output of the first voltage controlled oscillator therefrom to generate the first feedback frequency for delivery to the phase locked loop circuit; a frequency converter for mixing the output of the first voltage controlled oscillator local oscillator and a second feedback frequency therefrom to generate a mixed frequency; a first filter for filtering the mixed frequency; a phase comparator for generating a voltage signal corresponding to a phase difference in between an input frequency to the frequency converter and the output frequency of the first filter; a second filter for converting the voltage signal of the phase comparator to a DC voltage and eliminating any noise component of the converted voltage signal; a second voltage controlled oscillator receiving the output of the second filter as a control voltage so as to provide a resultant output frequency by generating the second feedback frequency responsive to the control voltage; and an amplifier means coupled to the second voltage controlled oscillator for amplifying the resultant output frequency to a given level.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE PREFERRED EMBODIMENT

Figure 1:
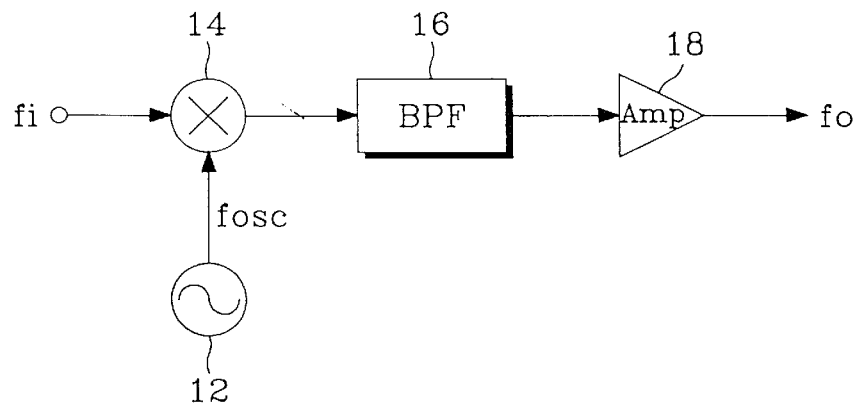
FIG. 1 is a block diagram illustrating the construction of a frequency converter in accordance with the principles of contemporary circuit design.

Referring to FIG. 1, the circuit is constructed as a frequency converter with a frequency mixer 14 receiving an input frequency $fi$ and an oscillation frequency $fosc$ supplied from a local oscillator 12 thereby to provide an output $|fi \pm fosc|$. Since the local oscillation frequency $fosc$ is equal to the input frequency $fi$ plus an output frequency $fo$, that is, ($fi+fo$), an output frequency of frequency mixer 14 is equal to ($2fi+fo$) or $fo$. A band-pass filter (BPF) 16 passes only the $fo$ frequency band component of the input frequency, and is connected to an amplifier 18 to output an amplified output frequency $fo$. In the above circuit arrangement, as the output of the mixer 14 inputting the input frequency $fi$ and the local oscillation frequency $fosc$ is generally converted to the output frequency $fo$, it is usually required to use a band pass filter having excellent characteristics for removing any harmonic components from the frequency applied to the mixer 14 which often results in the generation of an unstable output frequency $fo$ because of appreciable harmonic components of the input frequency $fi$ and the local oscillation frequency $fosc$. With this design, it may be appreciated that errors quite frequently occur in achieving a desirable output frequency, thereby causing difficulty in providing either a stable frequency of data or voice signals for a user.

Figure 2:
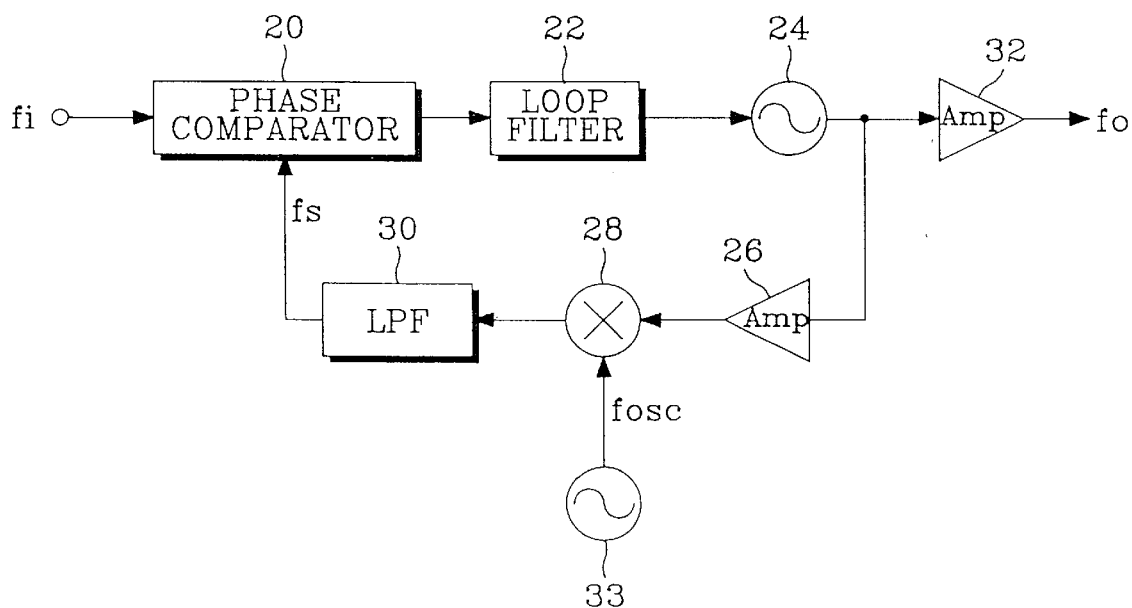
FIG. 2 is a block diagram illustrating the circuit construction of a preferred embodiment of a frequency converter constructed according to the principles of the present invention.

Referring now to FIG. 2, a block diagram illustrating the circuit construction of a preferred embodiment of the frequency converter according to the present invention is disclosed, in which a frequency mixer 28 is connected to receive an output $fosc$ of a local oscillator 33 and an output of an amplifier 26 and to output a mixed frequency signal to a low pass filter (LPF) 30 which filters the mixed frequency signal to provide a filtered output frequency signal $fs$. A phase comparator 20 compares the phase of an input frequency signal $fi$ to the phase of filtered frequency signal $fs$ and outputs a resultant to a loop filter 22. A voltage controlled oscillator 24 generates an output frequency signal and is controlled by the output of loop filter 22. The output frequency signal is input amplifiers 26 and 32. Amplifier 26 provides an amplified frequency output signal, i.e., a service band output frequency $fo$, to mixer 28 completing a phase locked loop. Amplifier 32 outputs an amplified frequency output signal $fo$.

Describing the operation of the above circuit in further detail, frequency mixer 28 provides a mixed frequency $|fo \pm fosc|$ of the oscillation frequency $fosc$ of the oscillator 33 and the service band output frequency $fo$, wherein the oscillation frequency $fosc$ is set into a value between $fo-fi$) and ($fo+fi$). LPF 30 receives the mixed frequency $|fo \pm fosc|$, that is, $2fo \pm fi$ or $fi$. A cutoff frequency of LPF 30 is given in advance to be adapted to the input frequency $fi$. Therefore, LPF 30 provides a filtered output $fs$ for a passband of the input frequency $fi$. Phase comparator 20 compares the phase input frequency $fi$ with the phase of filtered frequency $fs$ to provide the resultant output to loop filter 22, which output is a voltage dependent upon the difference in phase. Loop filter 22 functions to convert the voltage output of phase comparator 20 into a DC voltage as well as to remove its noise component therefrom. Voltage controlled oscillator 24 receives the DC voltage from loop filter 22 as a control voltage and generates a frequency, which is applied to amplifies 26 and 32. In this circuit construction, voltage controlled oscillator 24 is locked to stabilize the entire circuit when input frequency $fi$ and filtered frequency $fs$ are identical to each other, by operation of phase comparator 20 that generates a voltage indicative of the difference between input frequency $fi$ and filtered frequency $fs$ of the LPF 30.

Figure 3:
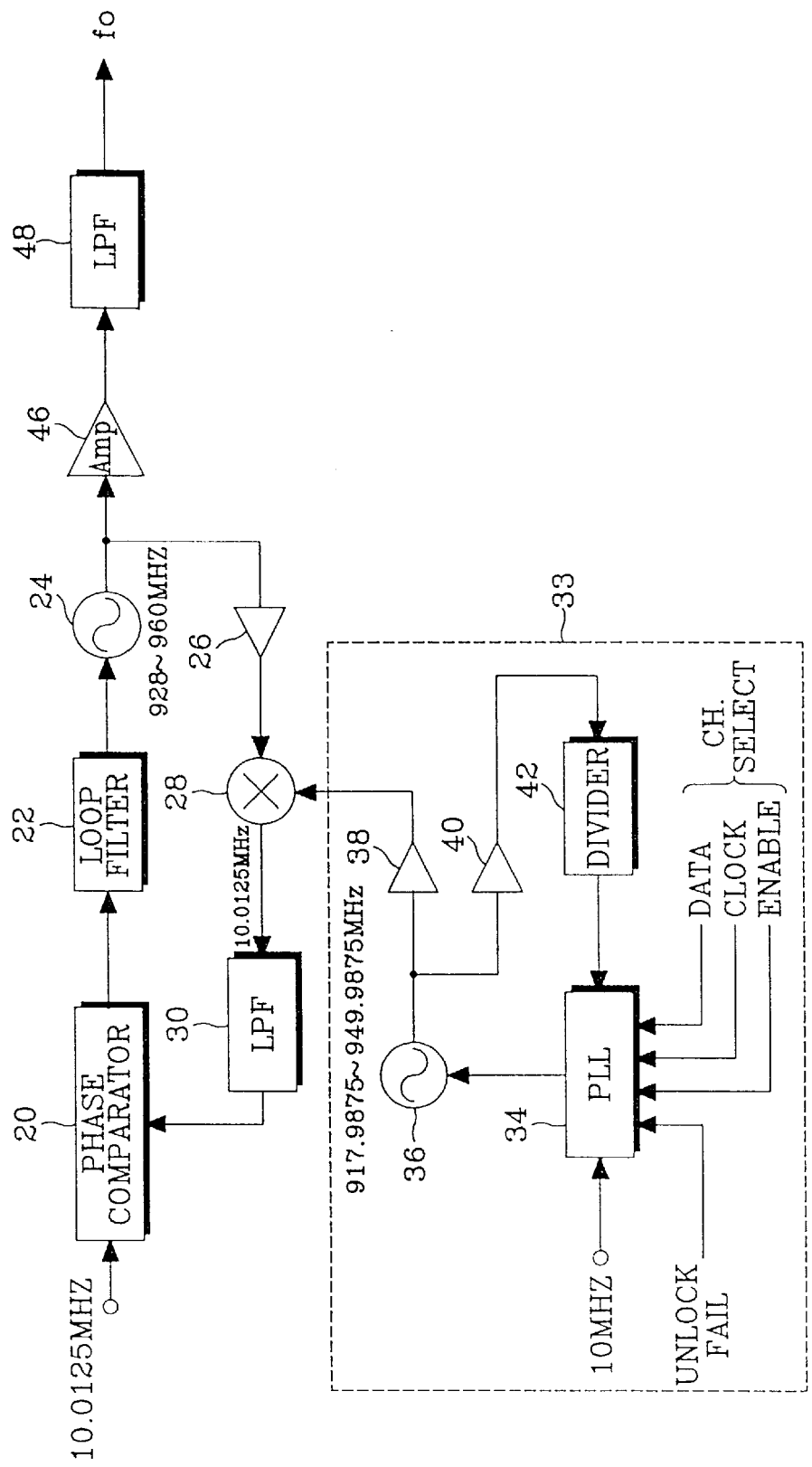
FIG. 3 is a block diagram illustrating the circuit construction of another preferred embodiment of a frequency converter constructed according to the principles of the present invention.

Referring to FIG. 3, shown is a circuit block diagram of a transmitter service unit (TSU) which is another preferred embodiment of a frequency converter according to the present invention. The TSU incorporates the circuit of FIG. 2, for generating a frequency in a range of 928–960 MHz operable in every 12.5 MHz unit. A frequency modulation board (not shown) is coupled prior to the TSU and is a kind of frequency converting module for receiving a stable 10-MHz reference clock and outputting a radio frequency (RF) signal of 10.0125 MHz to the TSU by means of applying an analog frequency conversion and a Non-Return to Zero Frequency Shift Keying modulation to a voltage controlled oscillator (VCO) of a phase locked loop (PLL) according to the present invention. The TSU is also provided with the above stable 10-MHz reference clock.

The circuit construction of FIG. 3 is similar to that of FIG. 2 in which local oscillator 33 is shown in further detail. Local oscillator 33 exercises an important effect upon the transmission quality of a transmitter. Referring now to the local oscillator 33, a PLL circuit 34, which receives the 10-MHz reference clock frequency from a frequency modulation board (FMB), includes a phase comparator and a loop filter, in which the phase comparator compares a first feedback frequency with the 10-MHz reference frequency and outputs a voltage based upon a result of the comparison. The output voltage is converted to a DC voltage through a loop filter wherein a noise component is removed. The DC voltage is then applied to a local oscillator 36 which is locked to a preferred frequency in order to generate a local oscillation frequency, wherein the locked frequency is between 917 and 950 MHz, i.e., 917.9875–949.9875 MHz, which is 10.0125 MHz lower than a preferred frequency of 928–960 MHz. The local oscillation frequency is applied to frequency mixer 28 through an amplifier 38 and to a divider 42 through an amplifier 40. Divider 42 divides of the local oscillation frequency to provide a divided signal to the phase comparator of the PLL 34. Further, a set of channel selection signals including DATA, CLOCK and ENABLE signals form a main control unit (not shown) are also applied to the phase comparator of PLL 34 to enable the local oscillator to be adjusted to a range of synchronizations in order to change the frequency of local oscillator 36, thereby causing a desired oscillation frequency to be generated as a result.

A modulated radio frequency signal of 10.0125 MHz from the FMB (not shown) is applied to phase comparator 20, and then an output of the voltage controlled oscillator 24 having an oscillation frequency of 928–960 MHz is applied to frequency mixer 28 through amplifier 26. Frequency mixer 28 generates a mixed frequency signal in response to the output of local oscillator 36 and the output of the voltage controlled oscillator 24. LPF 30 passes only the 10.0125 MHZ frequency component of the mixed output signal from mixer 28, and provides the 10.0125 MHz filtered output to phase comparator 20. As a result, a voltage corresponding to the phase difference between the 10.0125-MHz frequency signal supplied from the FMB and the 10.0125-MHz frequency signal generated mixer 28 is generated in phase comparator 20 and then delivered to loop filter 22. Loop filter 22 converts the output of phase comparator 20 to a DC (i.e., a constant polarity) voltage for a control voltage applied to voltage controlled oscillator 24 which in turn generates a resultant frequency under control of the control voltage. As a result, when the phase of the output frequency of frequency mixer 28 and the phase of the frequency from the FMB are identical to each other, voltage controlled oscillator 24 is locked to stabilization of the circuit, by which the oscillation frequency provided from voltage controlled oscillator 24 is applied to a following amplifier 46 and amplified to a given level, for instance, up to about 5 W. A LPF 48 suppresses any noise component of the output of amplifier 46 and consequently provides a stable output frequency $fo$ as a synchronized output frequency of the TSU circuit of FIG. 3. In the meanwhile, when an active UNLOCK FAIL signal is applied to the phase comparator of PLL 34, or to phase comparator 20 connected to the LPF 30, the TSU circuit does not generate a synchronized output frequency.

As may be apparent from the foregoing, the present invention enables the generation of a highly stable frequency output through a loop circuit using the phase locked loop. Furthermore, even if any appreciable harmonic component were to be included in both the input frequency $fi$ to the circuit and the output frequency $fs$ from the LPF 30, they could be effectively eliminated by phase comparator 20, loop filter 22 and voltage controlled oscillator 24, so that the resultant output frequency is locked in stabilization to produce a stable frequency.

While there has been illustrated and described what is considered to be a preferred embodiment of the present invention, it will be understood by those skilled in the art that various changes and modifications may be made, and equivalents made be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A frequency converter, comprising:

local oscillator means for generating a local oscillation frequency signal;

a mixer for mixing said local oscillation frequency signal and a feedback frequency signal to generate a mixed frequency signal;

a first filter for outputting a first filtered frequency signal by filtering said mixed frequency signal;

a phase comparator for generating a voltage signal corresponding to a phase difference between an input frequency to said frequency convertor and said first filtered frequency signal output from said first filter;

a second filter for converting said voltage signal output by said phase comparator to a direct-current (DC) voltage having any noise component eliminated by said second filter; and a voltage controlled oscillator receiving said DC voltage as a first control voltage for generating a stable output frequency signal, said stable output frequency signal being provided as said feedback frequency signal to said mixer.

2. The frequency converter as set forth in claim 1, further comprising an amplifier means for outputting an amplified frequency output signal by amplifying said stable output frequency signal to a predetermined level.

3. The frequency converter as set forth in claim 2, further comprising a low pass filter for suppressing noise components that may be in said amplified frequency output signal.

4. The frequency converter as set forth in claim 1, wherein the first filtered frequency signal output by said first filter is substantially the same as said input frequency to said frequency convertor.

5. The frequency converter as set forth in claim 1, wherein said local oscillator means comprises:

a local oscillator for generating said local oscillation frequency signal;

an amplifier for amplifying said local oscillation frequency signal for output to said mixer, said amplifier amplifying said local oscillation frequency signal to a predetermined level;

a second amplifier for outputting an amplified frequency signal by amplifying said local oscillation frequency signal;

a divider for dividing said amplified frequency signal output from said second amplifier; and a phase locked loop circuit for generating a second DC voltage by comparing an output of said divider to an input reference clock frequency signal and filtering a resultant thereof, said second DC voltage being applied as a second control voltage for controlling said local oscillator.

6. The frequency converter as set forth in claim 1, wherein said input frequency has a frequency of 10.0125 MHZ, said local oscillation frequency signal has a frequency between 917 and 950 MHZ, said feedback frequency signal has a frequency between 928 and 960 MHZ, and said mixed frequency signal has a frequency of 10.0125 MHz.

7. The frequency converter as set forth in claim 5, wherein said input reference clock frequency signal has a frequency of 10 MHZ, said input frequency has a frequency of 10.0125 MHZ, said local oscillation frequency signal has a frequency between 917.9875 and 949.9875 MHZ, said feedback frequency signal has a frequency between 928 and 960 MHZ, and said mixed frequency signal has a frequency of 10.0125 MHZ.

8. The frequency converter as set forth in claim 5, wherein said phase locked loop circuit receives channel selection signals comprising a data signal, a clock signal and an enable signal, to enable said local oscillation frequency signal of said local oscillator to be adjusted between 917.9875 and 949.9875 MHZ.

9. A frequency converter, comprising:

a local oscillator for generating a local oscillation frequency signal;

a first amplifier for providing a local frequency signal by amplifying said local oscillation frequency signal to a first predetermined level;

a second amplifier for outputting an amplified frequency signal by amplifying said local oscillation frequency signal;

a divider for dividing said amplified frequency signal output from said second amplifier;

a phase locked loop circuit for generating a first direct-current (DC) voltage by comparing an output of said divider to an input reference clock frequency signal and filtering a resultant thereof, said first DC voltage being applied as a first control voltage for controlling said local oscillator;

a mixer for mixing said local frequency signal and a feedback frequency signal to generate a mixed frequency signal;

a first filter for outputting a first filtered frequency signal by filtering said mixed frequency signal;

a phase comparator for generating a voltage signal corresponding to a phase difference between an input frequency to said frequency convertor and said first filtered frequency signal output from said first filter;

a second filter for converting said voltage signal output by said phase comparator to a second DC voltage having any noise component eliminated by said second filter; and a voltage controlled oscillator receiving said second DC voltage as a second control voltage for generating a stable output frequency signal, said stable output frequency signal being provided as said feedback frequency signal to said mixer.

10. The frequency converter as set forth in claim 9, wherein said input reference clock frequency signal has a frequency of 10 megaHertz, said input frequency has a frequency of 10.0125 megaHertz, said local frequency signal has a frequency between 917.9875 and 949.9875 megaHertz, said feedback frequency signal has a frequency between 928 and 960 megaHertz and said mixed frequency signal has a frequency of 10.0125 megaHertz.

11. The frequency converter as set forth in claim 9, further comprising a third amplifier for outputting an amplified frequency output signal by amplifying said stable output frequency signal to a second predetermined level.

12. The frequency converter as set forth in claim 11, further comprising a low pass filter for suppressing noise components that may be in said amplified frequency output signal.

13. The frequency converter as set forth in claim 9, wherein the first filtered frequency signal output by said first filter is substantially the same as said input frequency to said frequency convertor.

14. The frequency converter as set forth in claim 9, wherein said phase locked loop circuit receives channel selection signals comprising a data signal, a clock signal and an enable signal, to enable said local oscillation frequency signal of said local oscillator to be adjusted between 917.9875 and 949.9875 megaHertz.

15. The frequency converter as set forth in claim 9, wherein said phase locked loop circuit receives an unlock fail signal for permitting said frequency converter to generate said output frequency signal in a non-stable state.

* * * * *